United States Patent

Lee et al.

(10) Patent No.: US 9,653,415 B2
(45) Date of Patent: May 16, 2017

(54) SEMICONDUCTOR DEVICE PACKAGES AND METHOD OF MAKING THE SAME

(71) Applicant: Advanced Semiconductor Engineering, Inc., Kaohsiung (TW)

(72) Inventors: Wei-Hsuan Lee, Kaohsiung (TW); Sung-Mao Li, Kaohsiung (TW); Chien-Yeh Liu, Kaohsiung (TW)

(73) Assignee: ADVANCED SEMICONDUCTOR ENGINEERING, INC., Kaosiung (TW)

(*) Notice: Subject to any disclaimer, the term of this patent is extended or adjusted under 35 U.S.C. 154(b) by 0 days.

(21) Appl. No.: 14/625,383

(22) Filed: Feb. 18, 2015

(65) Prior Publication Data

US 2016/0240493 A1 Aug. 18, 2016

(51) Int. Cl.
| | |
|---|---|
| *H01L 29/66* | (2006.01) |
| *H01L 23/66* | (2006.01) |
| *H01L 23/552* | (2006.01) |
| *H01L 21/768* | (2006.01) |
| *H01L 23/31* | (2006.01) |
| *H01L 23/00* | (2006.01) |

(52) U.S. Cl.
CPC ........ *H01L 23/66* (2013.01); *H01L 21/76838* (2013.01); *H01L 23/3128* (2013.01); *H01L 23/552* (2013.01); *H01L 24/97* (2013.01); *H01L 2223/6677* (2013.01); *H01L 2224/16227* (2013.01); *H01L 2224/97* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC . H01L 21/67121; H01L 24/01; H01L 23/3114
USPC ........................................................ 257/659
See application file for complete search history.

(56) References Cited

U.S. PATENT DOCUMENTS

| 8,786,060 B2 | 7/2014 | Yen et al. |
|---|---|---|
| 2012/0062439 A1 | 3/2012 | Liao et al. |
| 2014/0028518 A1* | 1/2014 | Arnold .................. H01Q 1/526 343/841 |

\* cited by examiner

*Primary Examiner* — Elias M Ullah
(74) *Attorney, Agent, or Firm* — Foley & Lardner LLP; Cliff Z. Liu

(57) ABSTRACT

The present disclosure relates to a semiconductor device package. The semiconductor device package includes a substrate, a semiconductor device, a plurality of electronic components, a first package body, a patterned conductive layer and a feeding element. The semiconductor device and the plurality of electronic components are disposed on the substrate. The first package body covers the semiconductor device but exposes the plurality of electronic components. The patterned conductive layer is formed on the first package body. The feeding element electrically connects the patterned conductive layer to the plurality of electronic components.

16 Claims, 12 Drawing Sheets

SEMICONDUCTOR DEVICE PACKAGES AND METHOD OF MAKING THE SAME

BACKGROUND

1. Technical Field

The present disclosure relates generally to semiconductor device packages and method of making the same. More particularly, the present disclosure relates to semiconductor device packages having antennas.

2. Description of the Related Art

Wireless communication techniques, for example, using Bluetooth, WiFi, WiMax or other wireless communication interface, are popular with the users. An antenna is a major component for wireless communication techniques. Additionally, electronic products continue to trend toward slim, compact and lightweight form factors. The decrease in sizes of wireless communication devices has created a demand for a small size antenna that is integrated in the same package housing the wireless communication device coupled to the antenna. However, integrating an antenna into the package housing the wireless communication device presents technical challenges.

The incorporation of an antenna into a semiconductor device (e.g. a wireless communication device) package may result in electromagnetic interaction and coupling between the antenna and different parts of the semiconductor device. This could lead to reduced performance of the antenna in efficiency and bandwidth, among other things, and could also lead to a detuning of the antenna and possible malfunction of the semiconductor device.

A sputtering technique may be used to form the antenna in a patterned metal layer. However, an even thickness of such a patterned metal layer is not easily and precisely achieved by this technique, and the unevenness may adversely affect performance of the antenna. Further, components of a semiconductor device package, such as pads, pins, traces and ground planes, may also interfere with the antenna.

Some semiconductor device packages further incorporate a matching circuitry, to improve performance of the antenna, and the matching circuitry is covered by an encapsulating material during packaging or assembly. However, once the assembly process is completed, the antenna may no longer be adjusted because the matching circuitry is encapsulated. Failure to meet the performance criteria of the antenna may lead to loss of the packaged structure, including a relatively high cost semiconductor device.

Extra matching circuitry may be built on a system substrate (e.g. a printed circuit board (PCB) onto which the semiconductor device package substrate is mounted) to improve performance of the antenna incorporated into a semiconductor device package, but this is not effective in terms of cost and complexity reduction. Moreover, impedance mismatch between a semiconductor device package substrate and the system substrate may deteriorate performance of the antenna.

It is against this background that a need arose to develop the semiconductor device packages and related methods described herein.

SUMMARY

According to an embodiment of the present disclosure, a semiconductor device package is provided. The semiconductor device package includes a substrate, a semiconductor device, a plurality of electronic components, a first package body, a patterned conductive layer and a feeding element. The semiconductor device and the plurality of electronic components are disposed on the substrate. The first package body covers the semiconductor device but exposes the plurality of electronic components. The patterned conductive layer is formed on the first package body. The feeding element electrically connects the patterned conductive layer to the plurality of electronic components.

According to another embodiment of the present disclosure, a manufacturing method of making a semiconductor device package is provided. The method of making a semiconductor device package includes: providing a substrate having a first surface and a second surface opposite the first surface; mounting a plurality of first electronic components and a plurality of second electronic components on the first surface of the substrate; covering the plurality of first electronic components and the first surface of the substrate by a first encapsulation material to form a first package body, wherein the first package body exposes the plurality of second electronic components; and forming a patterned conductive layer on the first package body.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
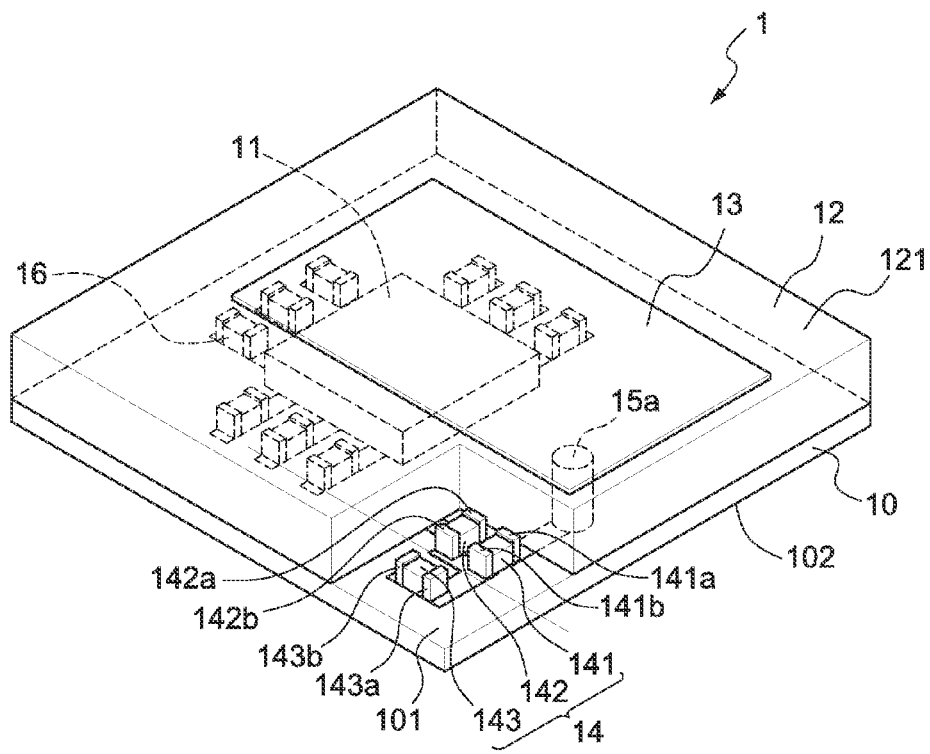
FIG. 1A illustrates a perspective view of a semiconductor device package in accordance with an embodiment of the present disclosure.
Figure 1B:
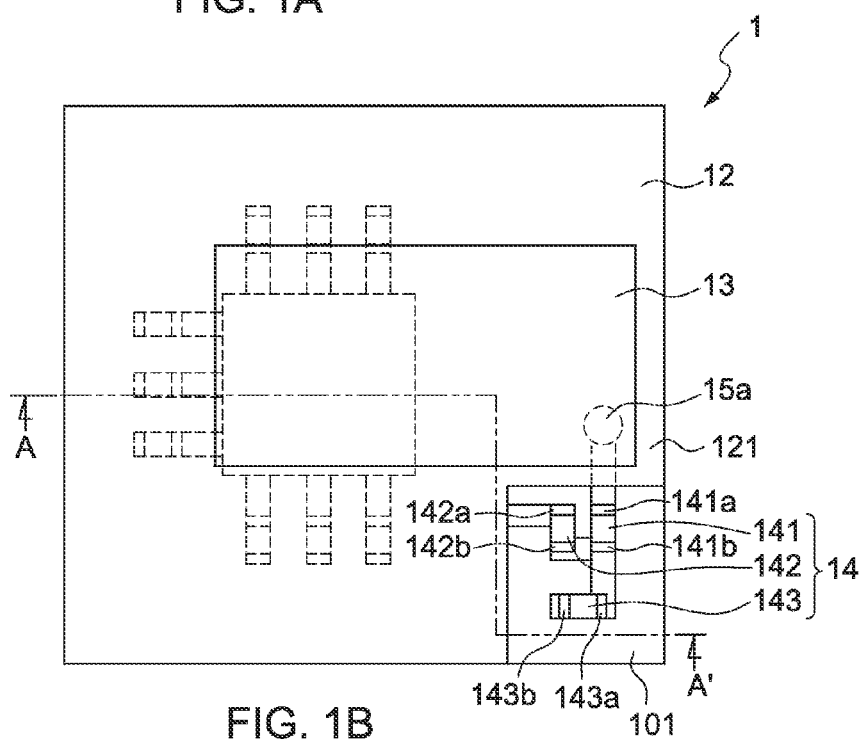
FIG. 1B illustrates a top view of the semiconductor device package as shown in FIG. 1A.

FIG. 1A illustrates a perspective view of a semiconductor device package in accordance with an embodiment of the present disclosure. FIG. 1B illustrates a top view of the semiconductor device package of FIG. 1A Referring to FIGS. 1A and 1B, the semiconductor package 1 includes a substrate 10, a semiconductor device 11, a first package body 12, a patterned conductive layer 13, a matching circuit 14, a feeding element 15a and a plurality of first electronic components 16.

The substrate 10 has a top surface 101 and a bottom surface 102 opposite the top surface 101. The substrate 10 may include, but is not limited to, for example, a multi-layered organic substrate, a ceramic substrate or a semiconductor substrate such as a silicon substrate although it may include other semiconductor materials. Although it is not shown or numbered in FIG. 1A, the substrate 10 also includes traces, pads, vias and at least one ground plane for electrical connection.

The semiconductor device 11 is disposed on the top surface 101 of the substrate 10. The semiconductor device 11 may be, but is not limited to, an integrated circuit (IC) formed on or in a silicon substrate.

The first electronic components 16 are disposed on the top surface 101 of the substrate 10. The first electronic components 16 may include, for example, active components (e.g., baseband component, memory, transceiver, power amplifier, low noise amplifier, switch or the like) or passive components (e.g., resistors, capacitors, inductors or the like). The first electronic components 16 are electrically connected to the semiconductor device 11.

The matching circuit 14 may include a plurality of second electronic components 141, 142 and 143. The second electronic components 141, 142 and 143 are disposed on the top surface 101 of the substrate 10. The second electronic components 141, 142 and 143 are disposed in the vicinity of a corner of the substrate 10. The second electronic components 141, 142 and 143 may include, for example, passive electronic components such as capacitors or inductors. Each of the second electronic components 141, 142 and 143 may be, but is not limited to, a surface mount device (SMD) type component including at least one pair of conductive terminals, such as respective conductive terminals labeled 141a, 141b, 142a, 142b, 143a and 143b. In the embodiment illustrated in FIGS. 1A and 1B, the conductive terminal 141b is electrically connected to the conductive terminal 142b and to the conductive terminal 143a, the conductive terminal 142a is electrically connected to the semiconductor device 11, and the conductive terminal 143b is grounded.

The first package body 12 has a top surface 121. The first package body 12 covers or encapsulates the top surface 101 of the substrate 10, the semiconductor device 11 and the first electronic components 16. However, the first package body 12 exposes the matching circuit 14. The first package body 12 may include, but is not limited to, an encapsulation material such as epoxy molding compound (EMC), polyimide (PI), a phenolic or a silicone.

The patterned conductive layer 13 is formed on the top surface 121 of the first package body 12. The patterned conductive layer 13 may include, but is not limited to, copper (Cu), aluminum (Al) or another suitable metal or alloy. The patterned conductive layer 13 may include, but is not limited to, a slot antenna, a loop antenna or a printed antenna.

The feeding element 15a is encapsulated in the first package body 12. The feeding element 15a penetrates the first package body 12 and electrically connects the patterned conductive layer 13 to the matching circuit 14. In this embodiment, the feeding element 15a electrically connects the patterned conductive layer 13 to the conductive terminal 141a. The feeding element 15a may be, for example, a metal pillar, a metal post or a conductive via, and may be formed of copper or another suitable metal or alloy.

Each of the second electronic components 141, 142 and 143 is detachable and replaceable, such that each of the components of the exposed matching circuit 14, which is exposed by the first package body 12, may be replaced by another suitable component to perform a different function or fulfill another design requirement. For example, a component with different capacitance or inductance may be used to replace one of the second electronic components 141, 142, or 143. Accordingly, although most of the components or devices (e.g. semiconductor device 11, first electronic components 16, feeding element 15a) of the semiconductor device package 1 are covered or encapsulated by the first package body 12, performance of the patterned conductive layer 13 may be adjusted by replacing a portion of, or all of, the matching circuit 14 with other suitable components.

Figure 1C:
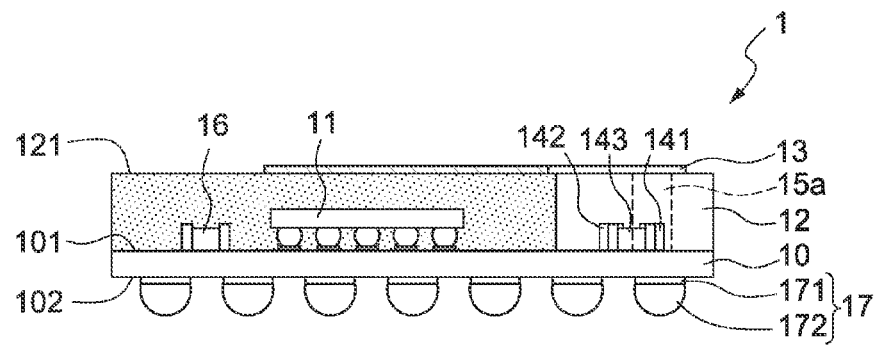
FIG. 1C illustrates a cross-sectional view of the semiconductor device package as shown in FIG. 1B.

FIG. 1C illustrates a cross-sectional view of the semiconductor device package across line AA' of FIG. 1B. Referring to FIG. 1C, a plurality of bonding elements 17 are formed on the bottom surface 102 of the substrate 10. The bonding elements 17 include a plurality of bonding pads 171 and solder balls 172.

Figure 2A:
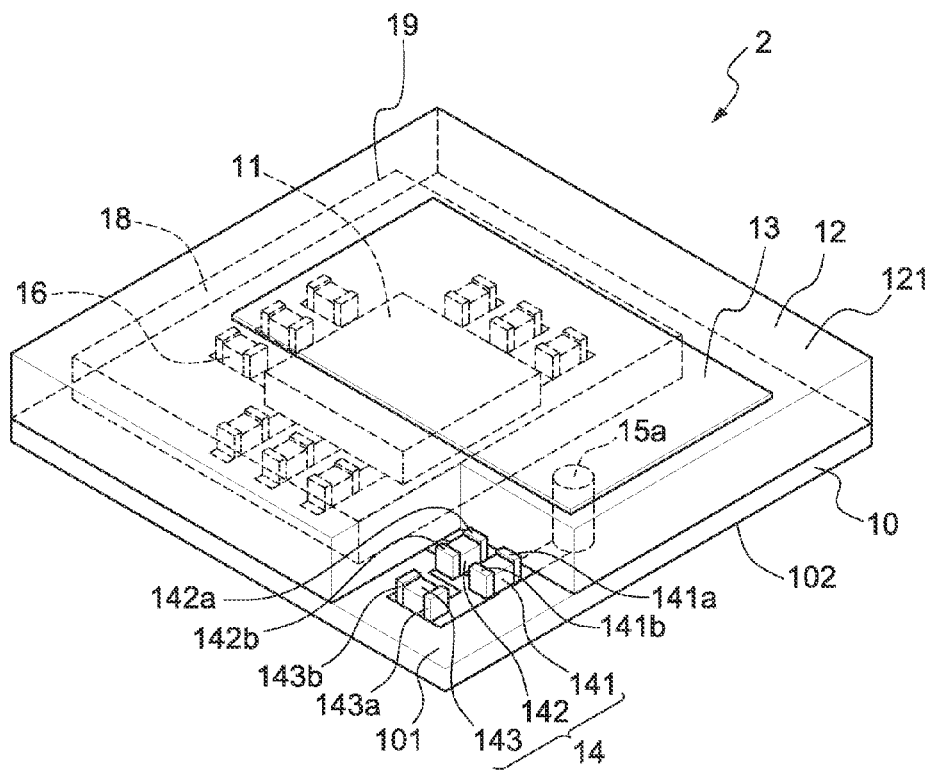
FIG. 2A illustrates a perspective view of a semiconductor device package in accordance with another embodiment of the present disclosure.
Figure 2B:
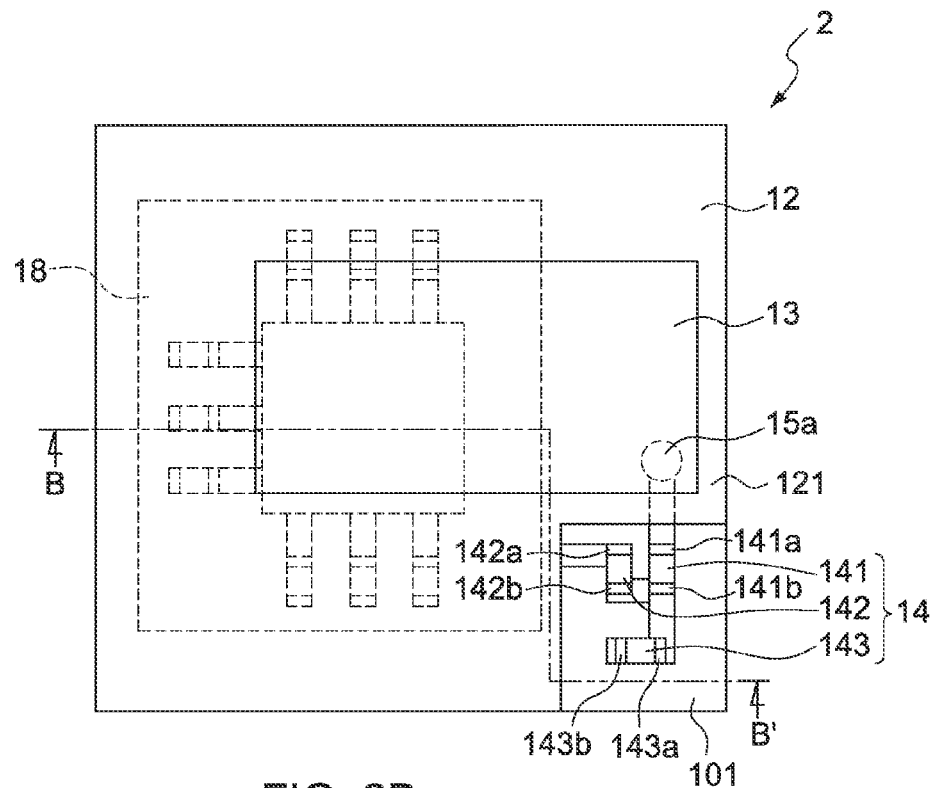
FIG. 2B illustrates a top view of the semiconductor device package as shown in FIG. 2A.

FIG. 2A illustrates a perspective view of a semiconductor device package in accordance with another embodiment of the present disclosure. FIG. 2B illustrates a top view of the semiconductor device package as shown in FIG. 2A.

Referring to FIG. 2A, the semiconductor device package 2 of FIG. 2A is similar to the semiconductor device package 1 illustrated and described with reference to FIG. 1A, except that the semiconductor device package 2 further includes an electromagnetic interference shield 18 and a second package body 19.

The second package body 19 encapsulates the semiconductor device 11, the first electronic components 16, and a portion of the top surface 101 of the substrate 10. However, the second package body 19 exposes the matching circuit 14. The second package body 19 may include, but is not limited to, an encapsulation material such as EMC, PI, a phenolic or a silicone.

The electromagnetic interference shield 18 covers the second package body 19. The electromagnetic interference shield 18 may be conformally formed on the second package body 19. In an embodiment, the electromagnetic interference shield 18 is deposited as a conductive thin film, which may include, for example, Al, Cu, chromium (Cr), tin (Sn), gold (Au), silver (Ag), nickel (Ni), stainless steel, or a mixture, an alloy, or other combination thereof. The electromagnetic interference shield 18 may include a single conductive layer. Alternatively, the electromagnetic interference shield 18 may include several conductive layers formed of the same material or different materials. The first package body 12 encapsulates the electromagnetic interference shield 18. The first package body 12 and the second package body 19 may be formed of the same material; however, different materials may be used for the first package body 12 and the second package body 19. In accordance with another embodiment of the present disclosure, the first package body 12 and the second package body 19 may be formed by different materials. The electromagnetic interference shield 18 may be grounded (e.g. electrically connected to a ground plane of the substrate 10) to provide an electrical pathway to reduce electromagnetic interference.

As described with respect to the embodiment of FIGS. 1A and 1B, each of the second electronic components 141, 142 and 143 of the exposed matching circuit 14 is detachable and replaceable by another suitable component, to perform a different function or fulfill another design requirement. In other words, for the semiconductor device package 2 of FIGS. 2A and 2B, matching circuit 14 is exposed by the second package body 19, the electromagnetic interference shield 18 and the first package body 12. Accordingly, although most of the components or devices (e.g. semiconductor device 11, first electronic components 16, feeding element 15a) of the semiconductor device package 2 are covered or encapsulated by the second package body 19, the electromagnetic interference shield 18 and the first package body 12, performance of the patterned conductive layer 13 may still be adjusted by replacing a portion of, or all of, the second electronic components 141, 142 and 143 of the matching circuit 14 with other suitable components.

Figure 2C:
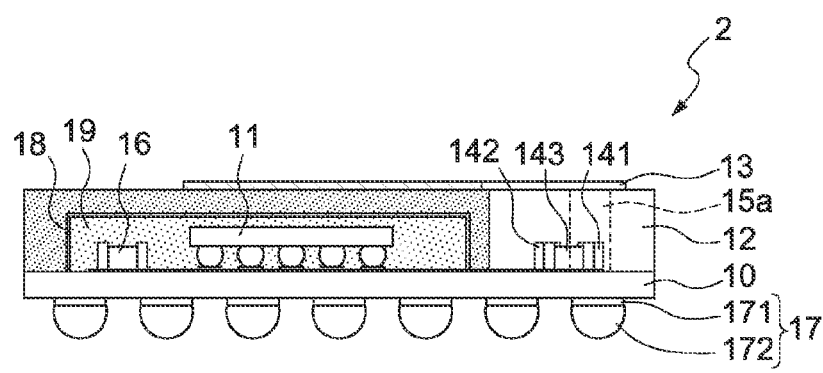
FIG. 2C illustrates a cross-sectional view of the semiconductor device package as shown in FIG. 2B.

FIG. 2C illustrates a cross-sectional view of the semiconductor device package across line BB' as shown in FIG. 2B.

Figure 3A:
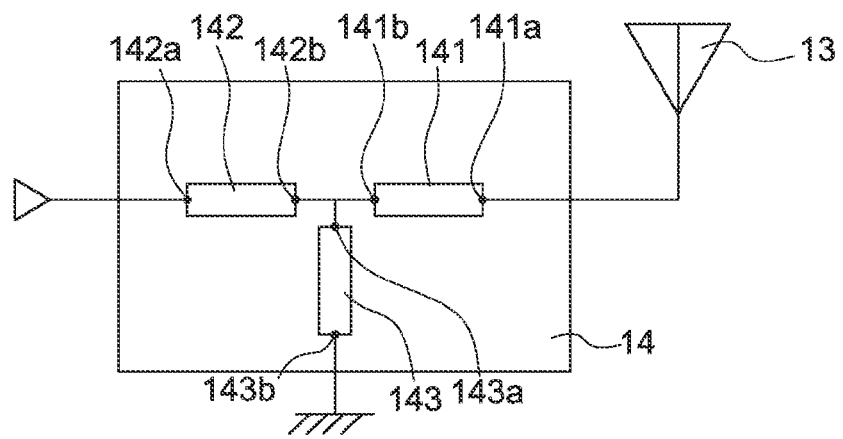
FIG. 3A illustrates a matching circuit of a semiconductor device package in accordance with an embodiment of the present disclosure.

FIG. 3A illustrates a matching circuit 14 of a semiconductor device package in accordance with an embodiment of the present disclosure. The matching circuit 14 is a T-type matching circuit and includes a plurality of second electronic components 141, 142 and 143. The second electronic component 141 has a pair of conductive terminals 141a and 141b. The second electronic component 142 has a pair of conductive terminals 142a and 142b. The second electronic component 143 has a pair of conductive terminals 143a and 143b. The conductive terminal 141b electrically connects to the conductive terminal 142b and to the conductive terminal 143a. The conductive terminal 142a electrically connects to a signal source, for example, an output of the semiconductor device 11 as illustrated and described with reference to FIG. 1A or FIG. 2A. The conductive terminal 143b is grounded. The conductive terminal 141a is electrically connected to an antenna 13 as illustrated and described with reference to FIG. 1A or FIG. 2A.

Other types of matching circuits 14 may be used alternatively to, or in combination with, the T-type matching circuit 14 of FIG. 3A. Some non-limiting examples are illustrated in FIGS. 3B, 3C, and 3D.

Figure 3B:
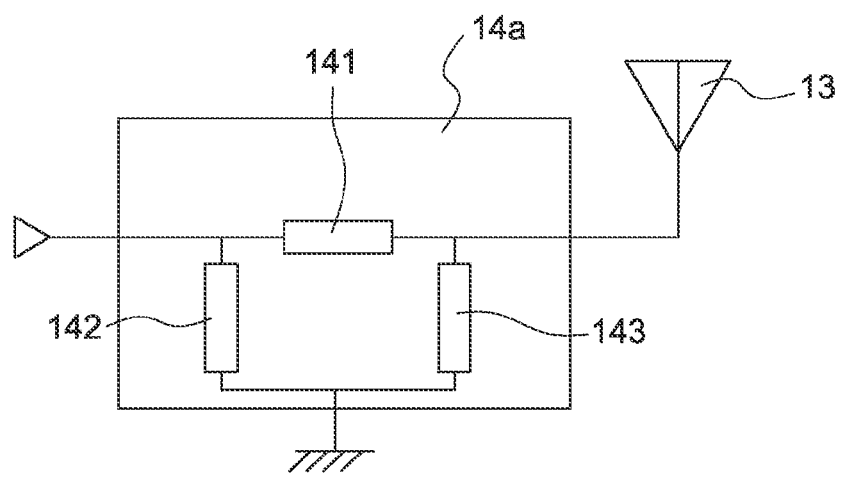
FIG. 3B illustrates a matching circuit of a semiconductor device package in accordance with another embodiment of the present disclosure.

FIG. 3B illustrates a i-type matching circuit 14a of a semiconductor device package in accordance with another embodiment of the present disclosure.

Figure 3C:
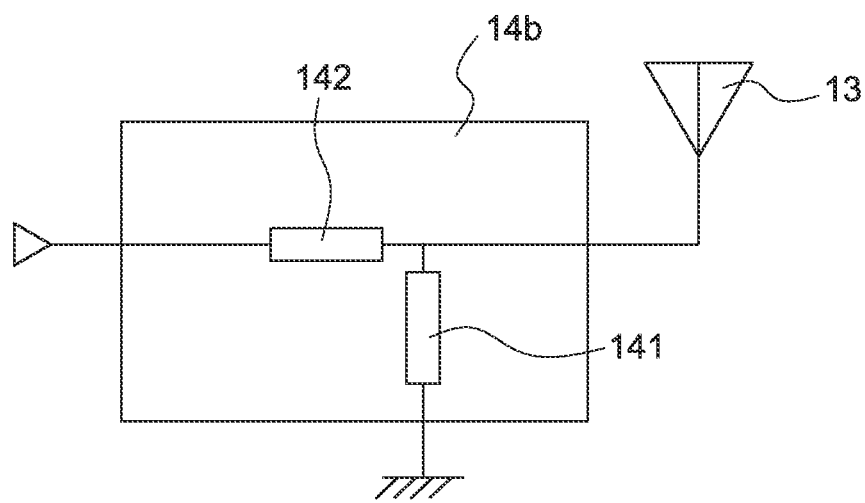
FIG. 3C illustrates a matching circuit of a semiconductor device package in accordance with another embodiment of the present disclosure.

FIG. 3C illustrates a F-type matching circuit 14b of a semiconductor device package in accordance with another embodiment of the present disclosure.

Figure 3D:
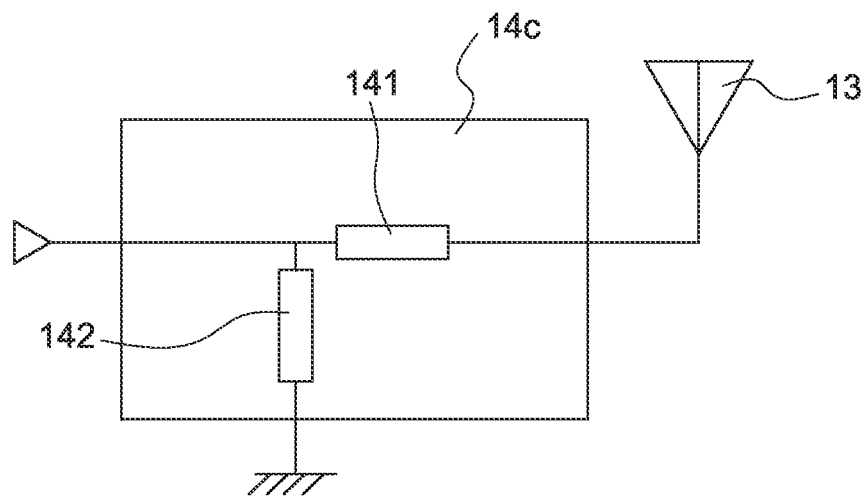
FIG. 3D illustrates a matching circuit of a semiconductor device package in accordance with another embodiment of the present disclosure.

FIG. 3D illustrates an L-type matching circuit 14c of a semiconductor device package in accordance with another embodiment of the present disclosure.

It is contemplated that each of the matching circuits 14, 14a, 14b and 14c as shown FIGS. 3A, 3B, 3C and 3D may be varied, such as including more components, or such as by combining two or more matching circuits.

Figure 4A:
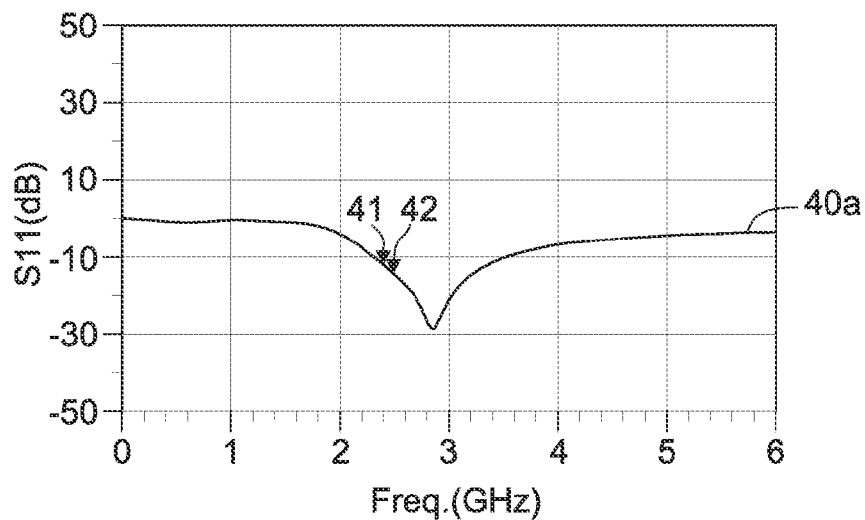
FIG. 4A illustrates an example of a frequency response of an antenna of a semiconductor device package in accordance with an embodiment of the present disclosure.

FIG. 4A illustrates a frequency response plot for an antenna of a semiconductor device package in which the matching circuit is not exposed. An important characteristic in determining the performance of the signals transmitted by an antenna is return loss, which refers to the reflected energy from the antenna. In FIG. 4A, return loss is plotted on the y-axis, labeled S11. The value of the return loss is a negative logarithmic number expressed in decibels (dB). FIG. 4A shows a frequency response 40a of an antenna for the semiconductor device package having no exposed matching circuit. Marker 41 indicates a return loss of −12.105 dB at a frequency of 2.400 Gigahertz (GHz), and marker 42 indicates a return loss of −14.413 dB at a frequency of 2.500 GHz.

Figure 4B:
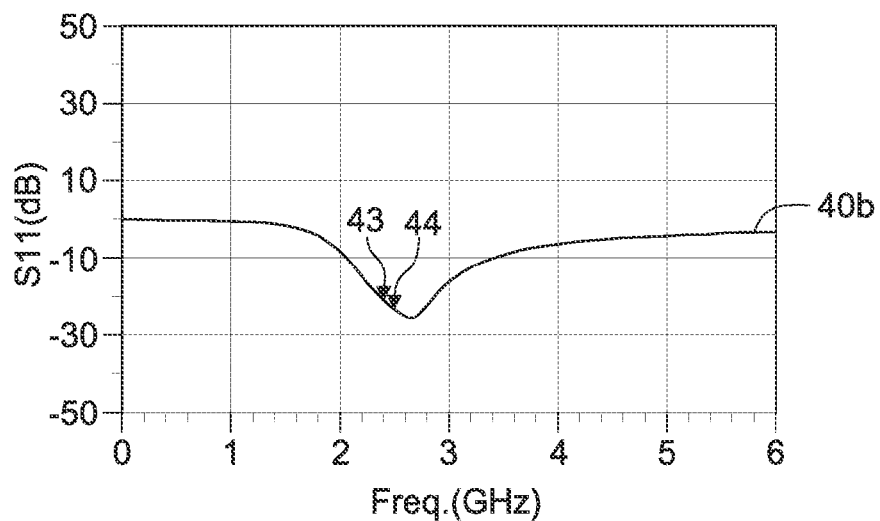
FIG. 4B illustrates an example of a frequency response of an antenna of a semiconductor device package in accordance with another embodiment of the present disclosure.

FIG. 4B illustrates a frequency response plot for an antenna of a semiconductor device package in accordance with an embodiment of the present disclosure. FIG. 4B shows a frequency response 40b of an antenna 13 of a semiconductor device package 2 as illustrated and described with reference to FIG. 2A, and including the matching circuit 14 of FIG. 3A. Marker 43 indicates a return loss of −21.159 dB at a frequency of 2.400 GHz, and marker 44 indicates a return loss of −23.413 dB at a frequency of 2.500 GHz.

Referring back to FIG. 4A, the semiconductor device package without exposed matching circuit has an average loss characteristic of −13 decibels (dB) over the frequency range of zero to 6 GHz. Comparing to FIG. 4B, the average loss characteristic over the same frequency range is improved to −22 dB using the exposed matching circuit as described with respect to FIG. 2A, with the matching circuit 14 of FIG. 3A. More generally, in some embodiments, the average loss characteristic is about −15 dB or less, about −18 dB or less, about −20 dB or less, or about −22 dB or less. Frequency response as described and illustrated with reference to FIG. 4A and FIG. 4B may be obtained, for example, by a Vector Network Analyzer (VNA).

FIG. 5A, FIG. 5B, FIG. 5C, FIG. 5D and FIG. 5E illustrate a manufacturing method in accordance with an embodiment of the present disclosure.

Figure 5A:
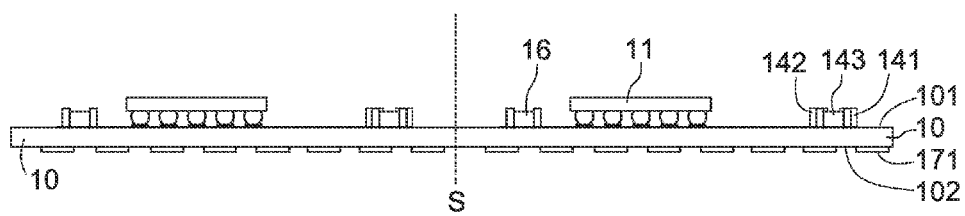
FIG. 5A, FIG. 5B, FIG. 5C, FIG. 5D and FIG. 5E illustrate a manufacturing method in accordance with an embodiment of the present disclosure.

Referring to FIG. 5A, a substrate strip having a plurality of substrates 10 is provided. The substrate strip may include kerfs or scribe lines (such as scribe line S shown in dotted line) which separate the individual substrates 10. Each substrate 10 has a top surface 101 and a bottom surface 102. A plurality of bonding pads 171 is formed on the bottom surface 102. The bonding pads 171 may be formed, for example, by photo-lithography or by a plating technology. A plurality of semiconductor devices 11, a plurality of first electronic components 16 and a plurality of second electronic components 141, 142, 143 are attached or mounted to the top surface 101. The semiconductor devices 11 and the second electronic components 141, 142 and 143 are electrically connected by an interconnect structure (not shown in FIG. 5A), which may include components such as pads, traces and vias, of each substrate 10.

Figure 5B:
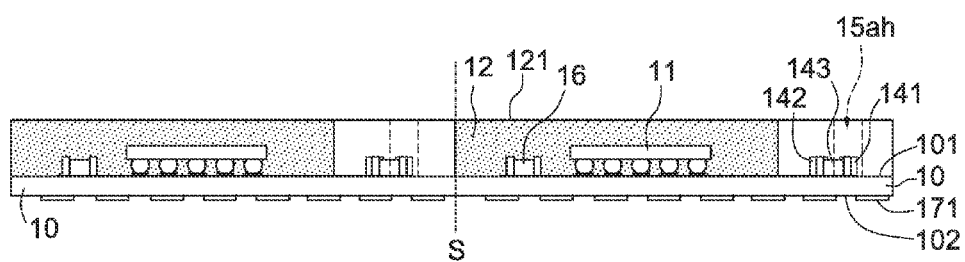

Referring to FIG. 5B, the top surface 101, the semiconductor devices 11 and the first electronic components 16 are covered or encapsulated by a first package body 12, which may be formed of an encapsulation material. The second electronic components 141, 142 and 143 are exposed by the first package body 12. A plurality of via holes 15ah are formed in the first package body 12.

A technique for forming the first package body 12 may be, but is not limited to, a molding technology which uses an encapsulation material with the help of mold chase (not shown), or dam and fill dispensing, to encapsulate the top surface 101, the plurality of semiconductor devices 11 and the first electronic components 16, but expose the second electronic components 141, 142 and 143. The via holes 15ah may be formed, for example, by laser drill or etching technique.

Figure 5C:
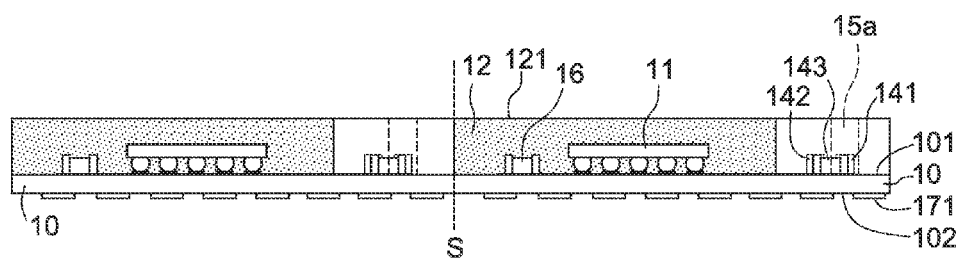

Referring to FIG. 5C, the via holes 15ah are filled with conductive material to form a plurality of vias 15a. The conductive material filled in the via holes 15ah may include, but is not limited to, copper or another suitable metal or alloy.

Figure 5D:
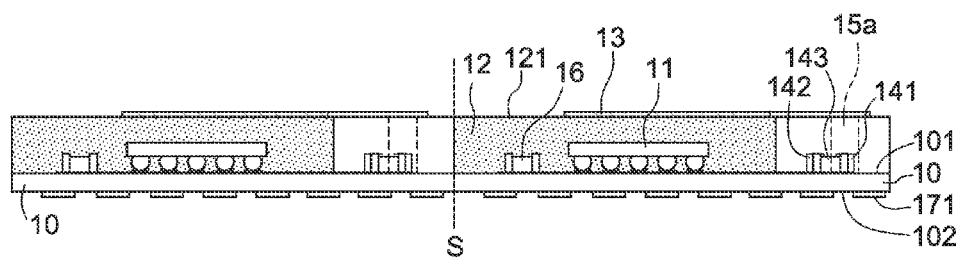

Referring to FIG. 5D, a patterned conductive layer 13 is formed on a top surface 121 of the first package body 12. The patterned conductive layer 13 is formed to contact the vias 15a, wherein vias 15a electrically connect the patterned conductive layer 13 to the second electronic components 141, 142 and 143. The patterned conductive layer 13 may be formed, for example, by a sputtering technique. Variations in thickness of the patterned conductive layer 13 may be compensated for by adjusting the second electronic components 141, 142 and 143, as described below.

Figure 5E:
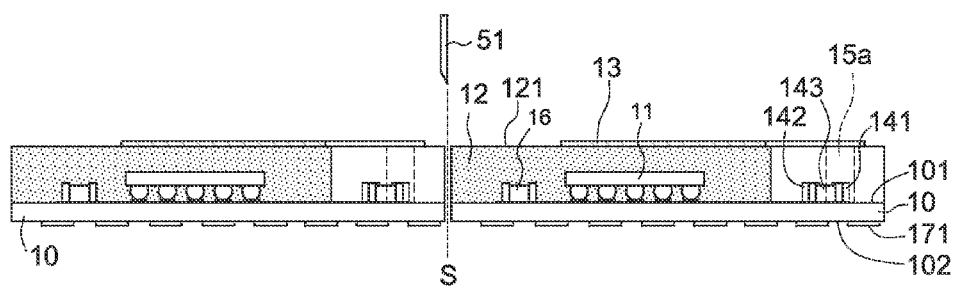

Referring to FIG. 5E, a singulation process is performed on the substrate strip. A cutting tool 51 may be used to cut the substrate strip along the kerfs or scribe lines (e.g., scribe line S) to perform the singulation process. Subsequent to the singulation process, a plurality of solder balls 172 (not shown in FIG. 5E) may be formed on the bonding pads 171 to form a plurality of semiconductor device packages 1 as shown in FIG. 1C.

Each of the second electronic components 141, 142 and 143 exposed by the first package body 12 is detachable and replaceable. For example, each of the exposed second electronic components 141, 142 and 143 may be replaced by at least one third electronic component (not shown in FIG. 5E) for impedance match or another design requirement. Accordingly, although semiconductor device 11, first electronic components 16, and feeding element 15a of the semiconductor device package are covered or encapsulated by the first package body 12, performance of the patterned conductive layer 13 may be adjusted by replacing a portion of, or all of, the second electronic components 141, 142 and 143 with the one or more third electronic components. The third electronic components may be similar to the second electronic components 141, 142 and 143, which may include, but are not limited to, passive electronic components such as capacitors or inductors.

FIG. 6A, FIG. 6B, FIG. 6C, FIG. 6D, FIG. 6E and FIG. 6F illustrate a manufacturing method in accordance with another embodiment of the present disclosure.

Figure 6A:
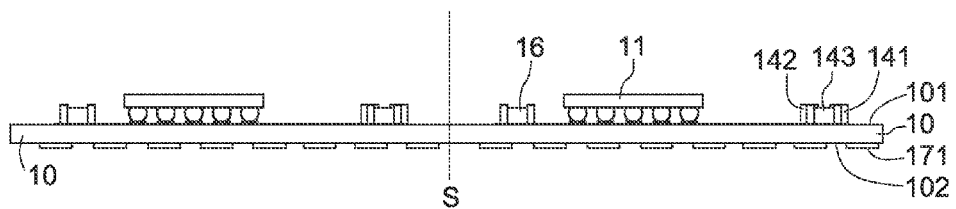
FIG. 6A, FIG. 6B, FIG. 6C, FIG. 6D, FIG. 6E and FIG. 6F illustrate a manufacturing method in accordance with another embodiment of the present disclosure.

Referring to FIG. 6A, a substrate strip having a plurality of substrates 10 is provided. The substrate strip may include kerfs or scribe lines (such as scribe line S shown in dotted line) which separate the individual substrates 10. Each substrate 10 has a top surface 101 and a bottom surface 102. A plurality of bonding pads 171 are formed on the bottom surface 102. The bonding pads 171 may be formed, for example, by photo-lithography or plating technology. A plurality of semiconductor devices 11, a plurality of first electronic components 16 and a plurality of second electronic components 141, 142, 143 are attached or mounted to the top surface 101. The semiconductor devices 11 and the second electronic components 141, 142 and 143 are electrically connected by an interconnect structure (not shown in FIG. 6A), which may include components such as pads, traces and vias, of each substrate 10.

Figure 6B:
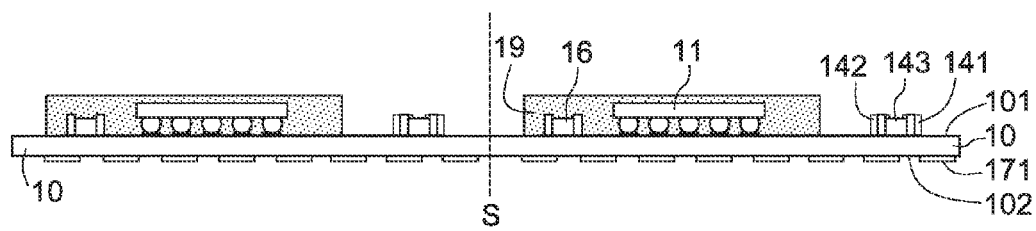

Referring to FIG. 6B, the top surface 101, the semiconductor devices 11 and the first electronic components 16 are covered or encapsulated by a second package body 19, which may be formed of an encapsulation material. The second electronic components 141, 142 and 143 are exposed by the second package body 19.

A technique for forming the second package body 19 may be, but is not limited to, a molding technology which uses an encapsulation material with the help of mold chase (not shown) to encapsulate the top surface 101, the semiconductor devices 11 and the first electronic components 16 but expose the second electronic components 141, 142 and 143.

Figure 6C:
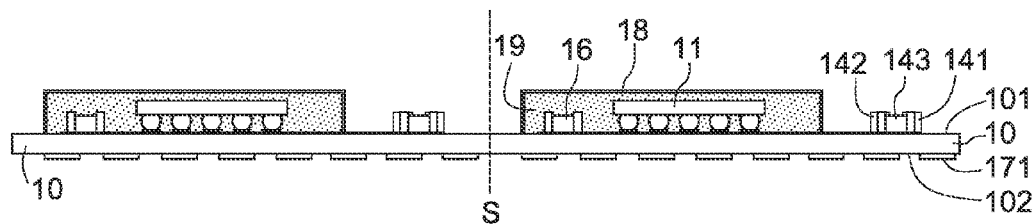

Referring to FIG. 6C, an electromagnetic interference shield 18 is conformally formed on the second package body 19. The electromagnetic interference shield 18 may be deposited as a conductive thin film, and may include, for example, Al, Cu, Cr, Sn, Au, Ag, Ni, stainless steel, or a mixture, an alloy, or other combination thereof. The electromagnetic interference shield 18 may be electrically connected to a ground plane of the substrate 10 (not shown in FIG. 6C) to provide an electrical pathway to reduce electromagnetic interference.

Figure 6D:
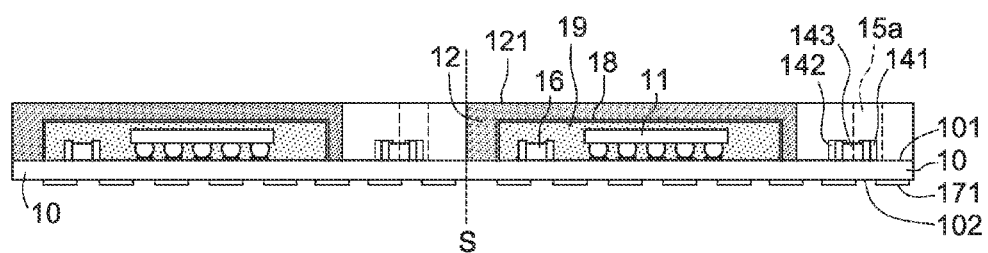

Referring to FIG. 6D, the top surface 101 and electromagnetic interference shield 18 are covered or encapsulated by a first package body 12, which may be formed of an encapsulation material. The second electronic components 141, 142 and 143 are exposed by the first package body 12. A plurality of vias 15a are formed in the first package body 12.

A technique for forming the first package body 12 may be, but is not limited to, a molding technology which uses an encapsulation material with the help of mold chase (not shown) to encapsulate the top surface 101 and electromagnetic interference shield 18 but expose the second electronic components 141, 142 and 143. The first package body 12 and the second package body 19 may be formed by the same material, or may be formed of different materials. The vias 15a may include, but are not limited to, copper or another suitable metal or alloy.

Figure 6E:
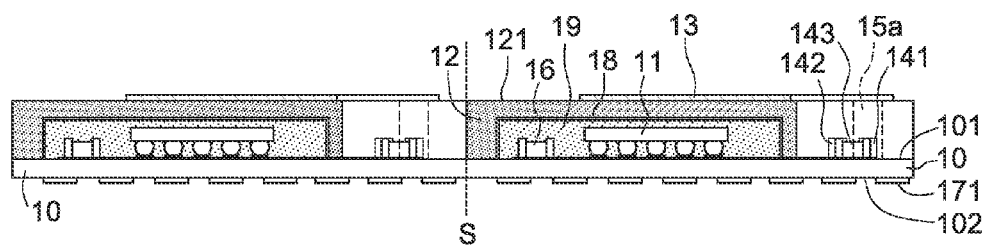

Referring to FIG. 6E, a patterned conductive layer 13 is formed on a top surface 121 of the first package body 12. The patterned conductive layer 13 is formed to contact the vias 15a, wherein vias 15a electrically connect the patterned conductive layer 13 to the second electronic components 141, 142 and 143. The patterned conductive layer 13 may be formed, for example, by sputtering technique.

Figure 6F:
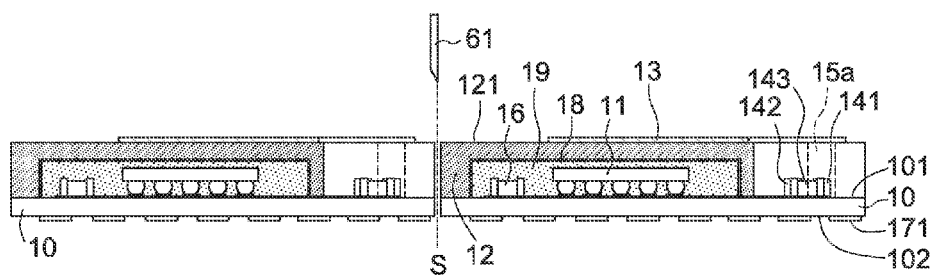

Referring to FIG. 6F, singulation is performed on the substrate strip. A cutting tool 61 may be used to cut the substrate strip along a scribe line (such as scribe line S shown in dotted line) to perform the singulation process. Subsequent to singulation, a plurality of solder balls 172 (not shown in FIG. 6F) may be formed on the bonding pads 171 to form a plurality of semiconductor device packages 2 as shown in FIG. 2C.

In accordance with another embodiment of the present disclosure, sheets made from pre-impregnated composite fibers (pre-preg) may be used instead of the molding compound. The sheets may be stacked or laminated to the top surface 101 to form the first package body 12 to expose the second electronic components 141, 142 and 143.

Each of the second electronic components 141, 142 and 143 exposed by the first package body 12 is detachable and replaceable. For example, each of the exposed second electronic components 141, 142 and 143 may be replaced by at least one third electronic component (not shown in FIG. 6F) for impedance match or another design requirement. Accordingly, although semiconductor device 11, first electronic components 16, and feeding element 15a of the semiconductor device package are covered or encapsulated by the first package body 12, performance of the patterned conductive layer 13 can still be adjusted by replacing a portion of, or all of, the second electronic components 141, 142 and 143 with the one or more third electronic components. The third electronic components may be similar to the second electronic components 141, 142 and 143, which may include, but are not limited to, passive electronic components such as capacitors or inductors.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the packages and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device package comprising:
   a substrate;
   a semiconductor device disposed on the substrate;
   a plurality of electronic components disposed on the substrate;
   a first package body covering the semiconductor device without covering the plurality of electronic components, thereby exposing the plurality of electronic components from the device package;
   a patterned conductive layer formed on the first package body; and
   a feeding element electrically connecting the patterned conductive layer to the plurality of electronic components, wherein the feeding element penetrates the first package body.

2. The semiconductor device package of claim 1, further comprising a second package body encapsulating the semiconductor device.

3. The semiconductor device package of claim 2, wherein the first package body covers the second package body.

4. The semiconductor device package of claim 2, wherein the first package body and the second package body are formed of different materials.

5. The semiconductor device package of claim 2, further comprising an electromagnetic interference shield covering the second package body.

6. The semiconductor device package of claim 5, wherein the first package body encapsulates the electromagnetic interference shield.

7. The semiconductor device package of claim 1, wherein each of the plurality of electronic components exposed by the first package body is detachable from the substrate.

8. The semiconductor device package of claim 1, wherein the plurality of electronic components are disposed in the vicinity of a corner of the substrate.

9. The semiconductor device package of claim 1, wherein the plurality of electronic components form a matching circuit.

10. The semiconductor device package of claim 1, wherein the plurality of electronic components electrically connect to the semiconductor device.

11. A semiconductor package, comprising:
    a semiconductor device;
    a matching circuit;
    a package body encapsulating side and top surfaces of the semiconductor device, the package body leaving exposed the matching circuit; and
    a patterned conductive layer disposed on the package body and electrically connected to the matching circuit, wherein the patterned conductive layer comprises an antenna.

12. The semiconductor package of claim 11, further comprising a feeding element connecting the patterned conductive layer to the matching circuit.

13. The semiconductor package of claim 12, wherein the feeding element is encapsulated by the package body around a periphery of the feeding element.

14. The semiconductor package of claim 11, wherein the package body is a first package body, further comprising a second package body encapsulating the semiconductor device and an electromagnetic interference shield conformally covering the second package body, wherein the first package body encapsulates the second package body and the electromagnetic interference shield.

15. The semiconductor package of claim 11, wherein the matching circuit comprises replaceable passive components that together provide tuning for the antenna.

16. The semiconductor package of claim 11, further comprising a substrate, wherein the matching circuit is disposed on a surface of the substrate at a corner of the substrate.

* * * * *